(12) United States Patent
Saito

(10) Patent No.: US 11,437,299 B2
(45) Date of Patent: Sep. 6, 2022

(54) SEMICONDUCTOR APPARATUS AND METHOD OF MANUFACTURING THE SAME

(71) Applicant: CANON KABUSHIKI KAISHA, Tokyo (JP)

(72) Inventor: Tatsuya Saito, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 106 days.

(21) Appl. No.: 16/890,289

(22) Filed: Jun. 2, 2020

(65) Prior Publication Data

US 2020/0395274 A1 Dec. 17, 2020

(30) Foreign Application Priority Data

Jun. 13, 2019 (JP) .............................. JP2019-110519

(51) Int. Cl.
*H01L 29/10* (2006.01)
*H01L 23/48* (2006.01)
*H01L 21/768* (2006.01)

(52) U.S. Cl.
CPC ...... *H01L 23/481* (2013.01); *H01L 21/76898* (2013.01)

(58) Field of Classification Search
CPC .................... H01L 23/481; H01L 21/76898
See application file for complete search history.

(56) References Cited

U.S. PATENT DOCUMENTS

| | | |
|---|---|---|
| 9,520,322 B2 | 12/2016 | Hayashi et al. |
| 10,141,368 B2 | 11/2018 | Ishida et al. |
| 10,403,676 B2 | 9/2019 | Hosokawa et al. |
| 10,468,322 B2 | 11/2019 | Kakuta et al. |
| 10,615,220 B2 | 4/2020 | Hosokawa et al. |
| 10,622,402 B2 | 4/2020 | Hosokawa et al. |
| 10,622,403 B2 | 4/2020 | Hosokawa et al. |
| 2006/0094231 A1* | 5/2006 | Lane ..................... H01L 23/481 |
| | | 438/637 |
| 2010/0013060 A1* | 1/2010 | Lamy .................... H01L 23/481 |
| | | 257/621 |
| 2013/0313674 A1* | 11/2013 | Noda ...................... G01J 5/025 |
| | | 257/467 |

FOREIGN PATENT DOCUMENTS

| | | |
|---|---|---|
| JP | 2013-140916 A | 7/2013 |
| JP | 2017-157751 A | 9/2017 |
| WO | 2016/159320 A1 | 10/2016 |

* cited by examiner

*Primary Examiner* — Victor A Mandala
*Assistant Examiner* — Colleen E Snow
(74) *Attorney, Agent, or Firm* — Venable LLP

(57) ABSTRACT

A semiconductor apparatus comprising a first substrate that has a first surface and a second surface and is provided with a through hole extending through from the first surface to the second surface and an insulating layer and a conductive member that are provided in the through hole is provided. The through hole includes a first opening formed in the first substrate and a second opening provided between the first opening and the second surface. The first opening and the second opening each have a tapered shape whose opening width decreases from the first surface to the second surface, and a first taper angle formed by a side surface of the first opening and a plane parallel to the second surface is smaller than a second taper angle formed by a side surface of the second opening and a plane parallel to the second surface.

25 Claims, 7 Drawing Sheets

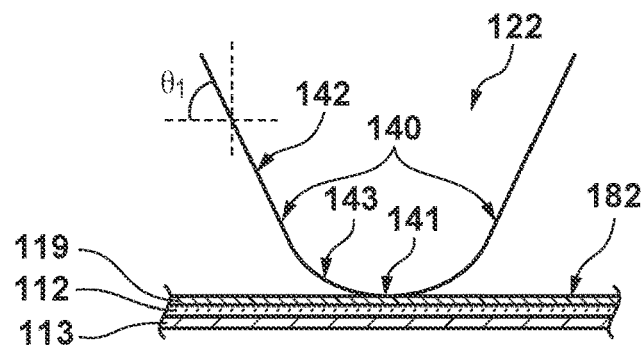
F I G. 5A
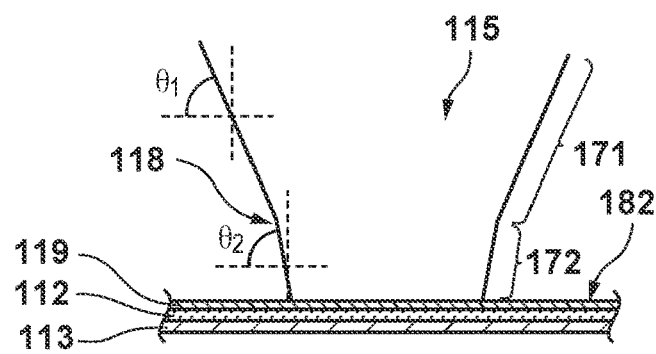
F I G. 5B
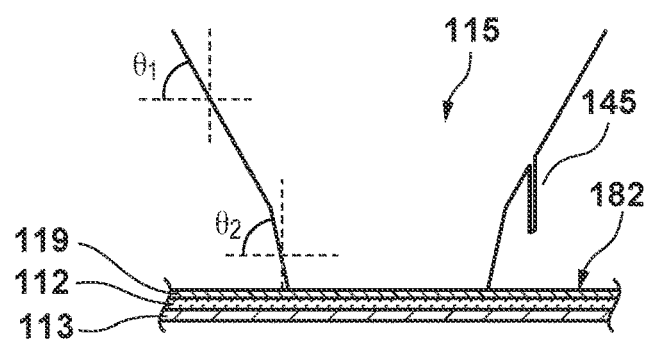
F I G. 5C
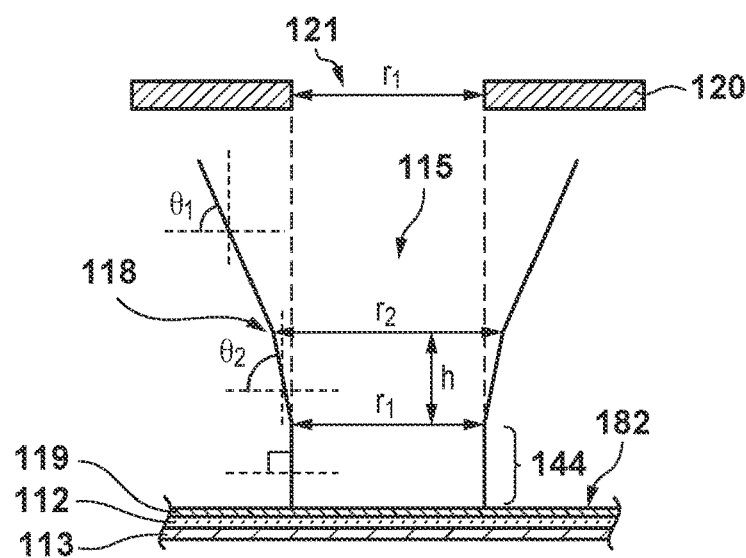
F I G. 5D

SEMICONDUCTOR APPARATUS AND METHOD OF MANUFACTURING THE SAME

BACKGROUND OF THE INVENTION

Field of the Invention

The present invention relates to a semiconductor apparatus and a method of manufacturing the same.

Description of the Related Art

It is known that a plurality of substrates are stacked on each other, and the substrates are electrically connected to each other by using through electrodes. Japanese Patent Laid-Open No. 2013-140916 discloses that a wineglass-shaped two-stage through hole having the side surfaces of a tapered upper portion and a cylindrical lower portion is formed to more uniformly form a conductive layer on the through hole.

SUMMARY OF THE INVENTION

The arrangement of the through electrode disclosed in Japanese Patent Laid-Open No. 2013-140916 is designed to improve the coverage of the conductive layer on the tapered upper portion. However, the coverage of the conductive layer may deteriorate with a decrease in distance to the cylindrical bottom portion of the through hole. Deterioration in the coverage of the conductive layer on the through hole is a cause of deterioration in the reliability of the through electrode.

Some embodiments of the present invention provide a technique advantageous in improving the reliability of a through electrode.

According to some embodiments, a semiconductor apparatus comprising a first substrate that has a first surface and a second surface on an opposite side to the first surface and is provided with a through hole extending through from the first surface to the second surface and an insulating layer and a conductive member that are provided in the through hole, wherein the through hole includes a first opening portion formed in the first substrate and a second opening portion provided between the first opening portion and the second surface, the first opening portion and the second opening portion each have a tapered shape whose opening width decreases from the first surface to the second surface, and a first taper angle formed by a side surface of the first opening portion and a plane parallel to the second surface is smaller than a second taper angle formed by a side surface of the second opening portion and a plane parallel to the second surface, is provided.

According to some other embodiments, a method of manufacturing a semiconductor apparatus comprising a first substrate that has a first surface and a second surface on an opposite side to the first surface and is provided a through hole extending through from the first surface to the second surface and an insulating layer and a conductive member that are provided in the through hole, wherein the through hole includes a first opening portion formed in the first substrate and a second opening portion provided between the first opening portion and the second surface, the first opening portion and the second opening portion each have a tapered shape whose opening width decreases from the first surface to the second surface, a first taper angle formed by a side surface of the first opening portion and a plane parallel to the second surface is smaller than a second taper angle formed by a side surface of the second opening portion and a plane parallel to the second surface, forming the through hole includes forming a mask pattern on the first surface, forming a concave portion forming a side surface of the first opening portion in the first substrate by etching the first substrate through an opening of the mask pattern, and forming the second opening portion by performing etching with higher anisotropy than in the forming the concave portion through the opening after the forming the concave portion, and the forming the concave portion is performed such that a height h from the second surface to a position at which taper angles switch between the first opening portion and the second opening portion satisfies $h \leq R \tan \theta_2$ where R is a length from an outer edge at the position at which the taper angles switch to an outer edge of the opening of the mask pattern in orthographic projection with respect to the first surface, and $\theta_2$ is the second taper angle, is provided.

Further features of the present invention will become apparent from the following description of exemplary embodiments (with reference to the attached drawings).

BRIEF DESCRIPTION OF THE DRAWINGS

FIGS. 5A to 5D are views for explaining a manufacturing method in FIGS. 2A to 2D in detail;

DESCRIPTION OF THE EMBODIMENTS

Figure 1:
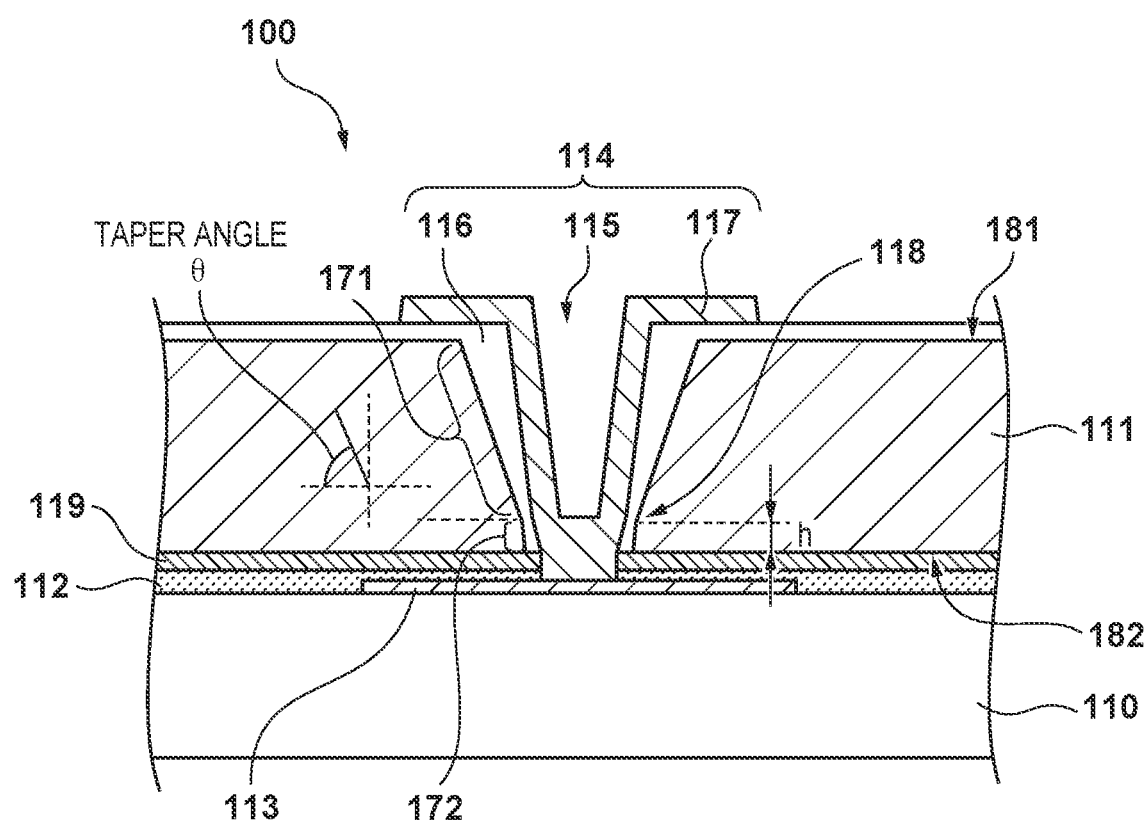
FIG. 1 is a sectional view of a through electrode provided in a semiconductor apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

The structure of a semiconductor apparatus and a manufacturing method according to an embodiment will be described with reference to FIGS. 1 to 7G. FIG. 1 is a sectional view showing the structure of a through electrode 114 provided in a semiconductor apparatus 100 according to this embodiment. As shown in FIG. 1, the semiconductor apparatus 100 has a substrate 110 and a substrate 111 bonded to each other through a bonding member 112 such as an adhesive agent. The substrate 111 has a surface 181 and a surface 182 facing the substrate 110 on the opposite side to the surface 181. The substrate 111 is provided with a through hole 115 extending through from the surface 181 to the surface 182. The through hole 115 is provided with a conductive member 117 that electrically connects elements provided on the surface 181 of the substrate 111 to an electrode layer 113 provided on the surface of the substrate 110 which is located beside the substrate 111. The through hole 115, the conductive member 117, and an insulating layer 116 for electrically insulating between the conductive member 117 and the substrate 111 constitute the through electrode 114.

The through hole 115 has a shape whose taper angle changes at a position 118 on a lower portion located beside the substrate 110. In this case, a taper angle in this specification is defined as an angle θ formed with respect to a plane parallel to the surface 182 of the substrate 111, as shown in FIG. 1. The through hole 115 includes an opening portion 171 and an opening portion 172 provided between the opening portion 171 and the surface 182, with the opening portions 171 and 172 having different taper angles. The position 118 at which the taper angles switch between the opening portion 171 and the opening portion 172 will be described later. The opening portion 171 and the opening portion 172 each have a tapered shape whose opening width gradually decreases from the surface 181 to the surface 182. In addition, the taper angle formed by the side surface of the opening portion 171 and a plane parallel to the surface 182 is smaller than the taper angle formed by the side surface of the opening portion 172 and a plane parallel to the surface 182.

The through hole 115 has a tapered shape whose opening width gradually decreases from the surface 181 to the surface 182, as described above, and does not have any side surface whose taper angle is 90° or 90° or more. Accordingly, this structure improves the coverage of the insulating layer 116 and the conductive member 117 up to the bottom portion (beside the substrate 110) of the through hole 115 as compared with a case in which the bottom portion of the through hole has a cylindrical shape (that is, the angle between the side surface of the through hole and the bottom surface of the substrate is 90°), as disclosed in, for example, Japanese Patent Laid-Open No. 2013-140916. This makes it possible to provide the highly reliable through electrode 114, which suppress an insulation failure, disconnection, and the like. This will be described in detail below.

Figure 2A:
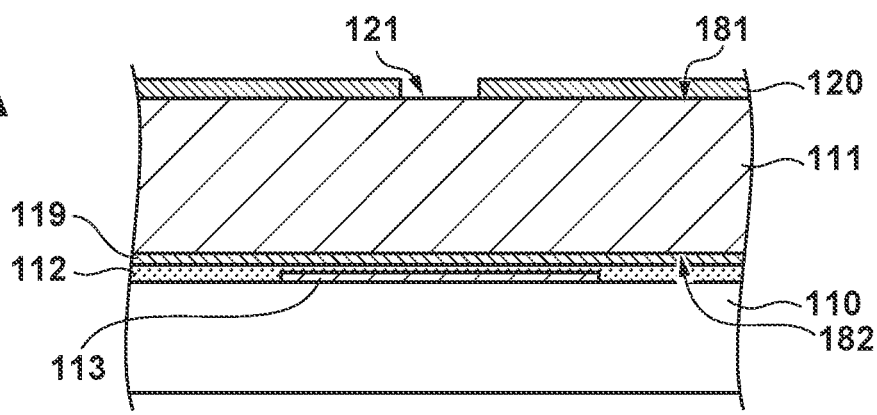
FIGS. 2A to 2D are views showing a method of manufacturing a through electrode in FIG. 1.

FIGS. 2A to 3C are sectional views schematically showing an example of a manufacturing process of the through electrode 114 shown in FIG. 1. First of all, as shown in FIG. 2A, the substrate 110 is bonded to the substrate 111 by using the bonding member 112. As the substrates 110 and 111, for example, semiconductor substrates made of silicon or the like may be used. Before the substrate 110 is bonded to the substrate 111, various types of elements including active elements such as transistors and passive elements such as capacitors, which are electrically connected to elements formed on the substrate 110, can be formed on the surface 181 of the substrate 111. Various types of elements may also be formed on the surface 182 of the substrate 111. Likewise, various types of elements including active elements such as transistors and passive elements such as capacitors, which are electrically connected to elements formed on the substrate 111, can be formed on the substrate 110. The elements formed on the substrate 110 may be formed on the surface of the substrate 110 which faces the substrate 111 or the surface of the substrate 110 which is located on the opposite side to the substrate 111. In addition, the electrode layer 113 to be connected to the through electrode 114 provided in the substrate 111 is formed on the surface of the substrate 110 which faces the substrate 111.

As the bonding member 112, for example, a thermosetting resin may be used. Before the substrate 110 is bonded (stuck) to the substrate 111 by using the bonding member 112, an insulator 119 may be formed on the surface 182 of the substrate 111. In this case, the substrate 110 can be bonded to the surface 182 of the substrate 111 through the bonding member 112, and the insulator 119 can be provided between the bonding member 112 and the surface 182. As described later, the insulator 119 may function as an etching stop layer when the through hole 115 is formed in the substrate 111 by etching. After the substrate 110 is bonded to the substrate 111, a mask pattern 120 having an opening 121 corresponding to the position of the electrode layer 113 on the substrate 110 is formed by coating the surface 181 of the substrate 111 with a resist. The step of forming the mask pattern 120 can use a known lithography step.

Figure 2B:
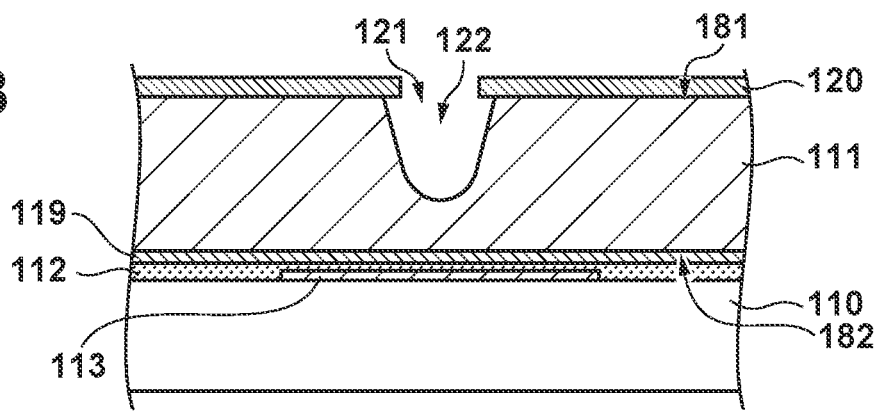

In the first etching step, the substrate 111 is etched through the opening 121 of the mask pattern 120 to form, in the substrate 111, a concave portion 122 forming the side surface of the opening portion 171. Although the shape of the concave portion 122 changes depending on the conditions for etching, etching is performed to form an undercut in an outer edge portion of the opening 121 of the mask pattern 120 and make the concave portion 122 have a tapered shape, as shown in FIG. 2B. For example, the first etching step is performed by plasma etching using an $SF_6/C_4F_8/O_2$ gas mixture. In this etching process, the concave portion 122 having a tapered shape is formed by simultaneously performing etching of silicon as the substrate 111 by mainly using $SF_6$, suppression of etching of silicon by forming a fluorocarbon film using $C_4F_8$, and ashing of the fluorocarbon film by using $O_2$. Accordingly, as the partial pressures of $SF_6$ and $O_2$ are increased, the etched shape tends to approach an isotropic shape. On the other hand, as the partial pressure of $C_4F_8$ is increased, the fluorocarbon film deposited on the side surface of the concave portion 122 suppresses etching of the side surface, and hence the taper angle of the etched shape increases and tends to approach an anisotropic shape. Accordingly, in the first etching step, the substrate 111 can be etched under the condition of the high partial pressures of $SF_6$ and $O_2$. The types of gases used in the first etching step are not limited to these gases, and various types of proper gases can be used.

Figure 2C:
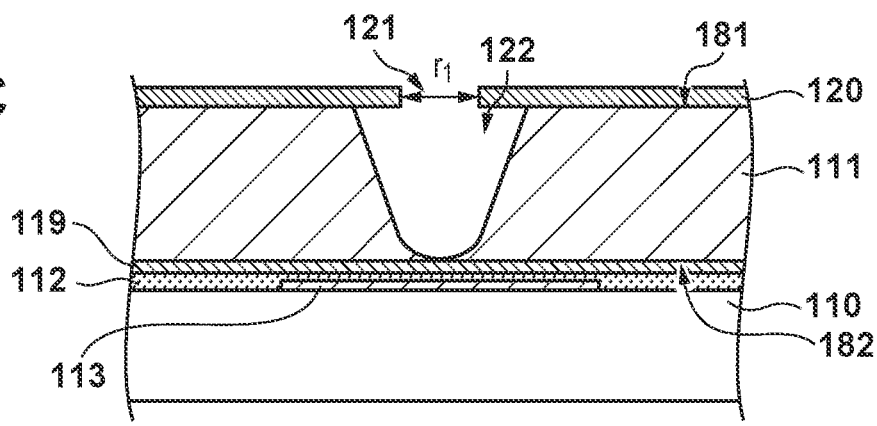

As the etching progresses, a distal end 141 of the concave portion 122 reaches the insulator 119, as shown in FIG. 2C. The insulator 119 may be, for example, silicon oxide ($SiO_2$). As the insulator 119, various types of materials that can ensure selectivity in etching with the material (for example, silicon) of the substrate 111. For example, silicon nitride or silicon oxynitride may be used for the insulator 119. When the distal end 141 of the concave portion 122 reaches the insulator 119 functioning as an etching stop layer, a portion near the distal end portion of the concave portion 122 having the tapered shape has a shape with a curvature. That is, as shown in FIG. 5A, the concave portion 122 includes a side portion 142 forming part of the side surface of the through hole 115 in a later step and a bottom portion 143 provided nearer to the surface 182 than the side portion 142 and having a curvature in a convex shape toward the surface 182.

Figure 4:
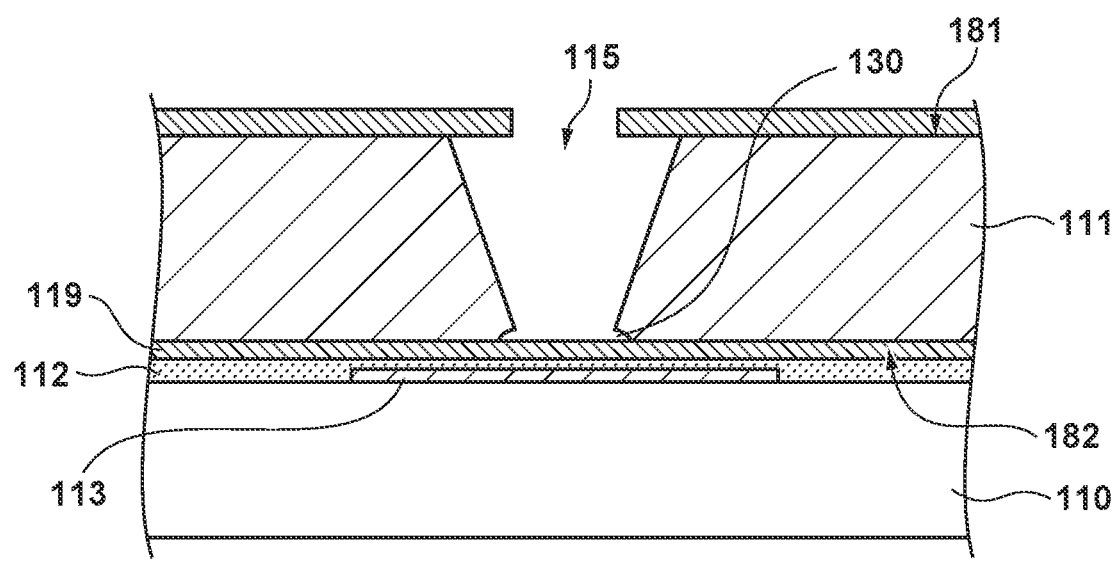
FIG. 4 is a view schematically showing a notch generated by the overreaching of a through hole.

The shape having the curvature near the distal end portion in this manner has a problem because when the insulating layer 116 is formed by etching an insulating material film 123 provided in the through hole 115 (to be described later), the insulating material film 123 is excessively etched to disappear (that is, the insulating layer 116 is not formed). Accordingly, in the first etching step, the overreaching time may be prolonged to form the through hole 115 while keeping the tapered shape. However, when the overreaching is prolonged, charge in a plasma can be accumulated in the insulator 119 using silicon oxide or the like. As shown in FIG. 4, a notch 130 is sometimes formed as the side surface of the substrate 111 is excessively etched at the bottom portion (beside the surface 182) of the through hole 115 due to the influence of this charge. Assume that the notch 130 is formed. In this case, when the insulating layer 116 and the conductive member 117 are formed, the insulating layer 116 and the conductive member 117 deteriorate in coverage with respect to the portion of the side surface of the through hole 115 in which the notch 130 is formed. This can lead to deterioration in the reliability of the through electrode 114.

Accordingly, in this embodiment, the through hole 115 is formed by etching the substrate 111, after the first etching step, under conditions different from those in the first etching step instead of being formed by only the first etching step. More specifically, the second etching step is performed to form the through hole 115 by forming the second opening portion by performing etching with higher anisotropy than in the first etching step through the opening 121 of the mask pattern 120. The second etching step uses an etching method with high anisotropy like the so-called Bosch process. The Bosch process includes step (1) of isotropically etching the substrate 111, step (2) of forming a protective film, and step (3) of removing the insulating film formed on the bottom surface of a groove, and switches the respective steps as one cycle at high speed in a short period of time. In addition, this method repeats this cycle. In step (1) of isotropically etching the substrate 111, a gas such as $SF_6$ is used, and the etching of the substrate 111 progresses by mainly using a radical as a reactive species. Performing step (1) for a long period of time will increase the etching amounts on the side surfaces of the formed opening portions 171 and 172. For this reason, this step is switched to step (2) of forming a protective film in a short period of time (for example, about several sec). In step (2) of forming a protective film, a protective film containing carbon and fluorine is deposited on the surfaces of the opening portions 171 and 172 by decomposing a gas like $C_4F_8$ in a plasma. Step (2) is also switched to step (3) in a short period of time of about several sec. In step (3) of removing part of a formed protective film, specifically a protective film on the bottom surface, a gas like $SF_6$ is used as a gas-based material. In addition, at this time, anisotropic ions are applied to the substrate 111 by applying relatively high bias power to the stage side of the etching apparatus on which the substrate 111 is placed. The protective film on the bottom is removed by anisotropic dry etching. At this time, the protective film on the side surfaces of the formed opening portions 171 and 172 is not removed because almost no ions are applied to the side surfaces as compared with the bottom surface. In step (1) of the next cycle, the side surfaces of the grooves are protected, and the etching of the bottom surface of the substrate 111 progresses. Repeating this cycle can gradually promote the etching of the substrate 111 in the depth direction.

As described above, in the Bosch process, the protection and etching of the side surfaces of the formed opening portions 171 and 172 are repeated to promote the etching vertically. For this reason, as shown in FIG. 2C, the etching of the side portion 142 of the concave portion 122 is suppressed, and the bottom portion 143 having a curvature near the distal end portion of the concave portion 122 is selectively etched to form the through hole 115 having a shape like that shown in FIG. 2D.

Figure 2D:
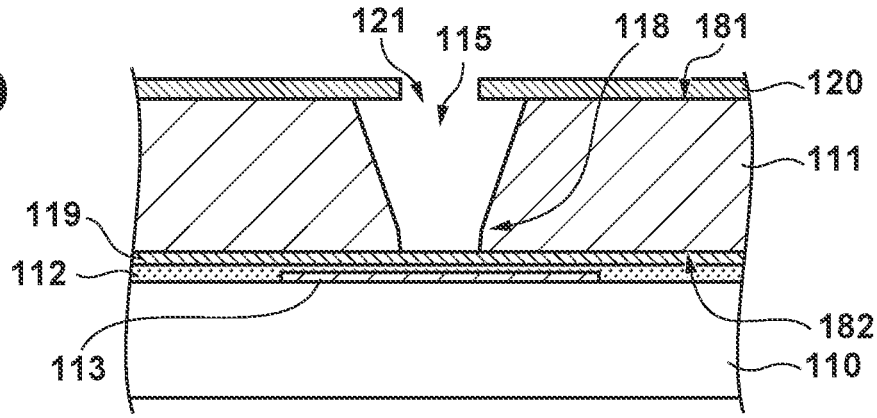

FIGS. 5A and 5B respectively show portions near the distal end portions of the concave portions 122 in FIGS. 2C and 2D. As shown in FIG. 5A, the portion near the distal end 141 of the concave portion 122 includes the side portion 142 forming part of the side surface of the through hole 115 and the bottom portion 143 provided nearer to the surface 182 than the side portion 142 and having a curvature in a concave shape toward the surface 182. The portion (that is, the side portion 142) above a boundary 140 between the side portion 142 and the bottom portion 143 has a shape (tapered region) with a taper angle $\theta_1$. The bottom portion 143 located nearer to the substrate 110 than the boundary 140 has a shape with a curvature. In the Bosch process, the side surface of the concave portion 122 to be etched is protected by the protective film deposited on the side surface. Accordingly, when the taper angle $\theta_1$ is large, the etching of the side portion 142 above the boundary 140 is suppressed in the second etching step. On the other hand, as the bottom portion 143 located nearer to the substrate 110 than the boundary 140 approaches the distal end portion, the side surface becomes more horizontal, and hence the etching of a portion nearer to the distal end portion progresses at a higher etching rate in the vertical direction in the second etching step. In the second etching step, therefore, the position 118 is formed near the boundary 140 shown in FIG. 5A at which the taper angles of the opening portion 171 and the opening portion 172 switch. In other words, the position of the boundary 140 formed at the end of the first etching step can be the position 118 at which the taper angles of the opening portion 171 and the opening portion 172 switch. As a result, as shown in FIG. 5B, the opening portion 172 having a taper angle $\theta_2$ satisfying $\theta_2 > \theta_1$ is formed below the position 118.

The coverage of the insulating layer 116 and the conductive member 117 with respect to the side surface of the through hole 115 increases with a decrease in taper angle $\theta_1$. However, with a decrease in the taper angle $\theta_1$ in the above manner, the etching of the side portion 142 (that can form the side surface of the opening portion 171 of the through hole 115) of the concave portion 122 located above the boundary 140 progresses in the second etching step for the following reason. When the taper angle $\theta_1$ is small, even a side surface portion of the protective film formed in step (2) in the Bosch process described above, other than the bottom portion, is partially removed in step (3), and etching progresses from a portion where silicon as the substrate 111 is exposed. When etching progresses from the portion where silicon is exposed in this manner, a hole 145 having a vertical streak shape is formed as shown in FIG. 5C.

As the taper angles $\theta_1$ and $\theta_2$ increase, the concave portion 122 (through hole 115) approaches a hole having a vertical shape. For this reason, in the step of forming the insulating layer 116 and the conductive member 117 after the formation of the through hole 115, the coverage of the insulating layer 116 and the conductive member 117 deteriorates, resulting in a decrease in the advantage of the through hole 115 having a taper angle. As described above, because the taper angle $\theta_2$ formed in the second etching step is formed to satisfy $\theta_2 > \theta_1$, in order to suppress the taper angle $\theta_2$ to less than 90°, it is necessary to suppress the taper angle $\theta_1$ to a predetermined angle or less.

The studies conducted in consideration of the above revealed that when the taper angle $\theta_1$ of the opening portion 171 of the through hole 115 was 80°, the best result was obtained. When the taper angle $\theta_1$ is less than 75°, the hole 145 having a vertical streak shape begins to be formed, as shown in FIG. 5C. In addition, as the taper angle $\theta_1$ becomes larger than 85°, the coverage of the insulating layer 116 and the conductive member 117 conspicuously deteriorates in the subsequent step, and the taper angle $\theta_2$ of the opening portion 172 of the through hole 115 approaches 90°. Therefore, the taper angle $\theta_1$ formed by the side surface of the opening portion 171 of the through hole 115 and a plane parallel to the surface 182 may be equal to or more than 75° and equal to or less than 85°. In this case, the taper angle $\theta_2$ that satisfies $\theta_2 > \theta_1$ and is formed by the side surface of the opening portion 172 of the through hole 115 and a plane parallel to the surface 182 may be equal to or more than 80° and less than 90°. In this case, the position of the boundary 140 formed upon completion of the first etching step described above almost coincided with the position 118 at which the taper angles of the opening portion 171 and the opening portion 172 switch. The following description is sometimes made assuming that the boundary 140 and the position 118 are at the same level from the surface 182 of the substrate 111.

In the second etching step, prolonging the overreaching time after the bottom portion 143 having a curvature in a convex shape toward the concave portion 122 disappears will form a vertical hole with the taper angle $\theta_2$ of 90° below the position 118 at which the taper angles switch. For this reason, the second etching step is terminated while the taper angle $\theta_2$ of the side surface of the opening portion 172 of the through hole 115 is less than 90°.

When the first etching step is terminated before the distal end of the concave portion 122 reaches the insulator 119, the position 118 at which the taper angles switch is separated from the insulator 119 (surface 182). Accordingly, in order to make the through hole 115 extend through, the time of the second etching step needs to be prolonged. As described above, in the second etching step, etching progresses in the vertical direction at a higher rate with a decrease in distance from the distal end portion (the portion nearest to the substrate 111) of the bottom portion 143 of the concave portion shown in FIG. 5A. That is, etching in the vertical direction progresses at the highest rate in a portion located immediately below the opening 121 of the mask pattern 120 shown in FIG. 5D. Accordingly, increasing the etching distance in the second etching step can make the concave portion 122, which is formed with the progress of the etching, have a vertical shape. That is, as shown in FIG. 5D, etching progresses in a portion below the position 118, at which the taper angles switch and the through hole 115 has a diameter $r_2$, at the taper angle $\theta_2$. However, when the etching further progresses in the second etching step to make the diameter of the concave portion 122 be almost equal to a diameter $r_1$ of the opening 121 of the mask pattern 120, the concave portion 122 (through hole 115) has an opening portion 144 having a vertical shape (cylindrical shape) below the position where the diameter of the concave portion 122 is almost equal to the diameter $r_1$. When the opening portion 144 with a taper angle of 90° is formed, the coverage of the insulating layer 116 and the conductive member 117 can deteriorate. In order to prevent the formation of the opening portion 144 with a vertical shape, the first etching step is terminated. That is, the first etching step may be performed such that a height h from the surface 182 to the position 118 at which the taper angles of the opening portion 171 and the opening portion 172 switch satisfies $h \leq R \tan \theta_2$ where in the orthographic projection with respect to the surface 181, R is the length from the outer edge at the position 118 at which the taper angle of the through hole 115 changes to the outer edge of the opening 121 of the mask pattern 120, and $\theta_2$ is the taper angle of the opening portion 172. Assume that the opening 121 of the mask pattern 120 is circular, the opening 121 has the diameter $r_1$, and the through hole 115 has the diameter $r_2$ at the position 118 at which the taper angles switch. In this case $R = (r_2 - r_1)/2$ Alternatively, if the opening 121 of the mask pattern 120 is rectangular, R can be the length from the outer edge of a side of interest at the position 118 at which the taper angle of the through hole 115 changes to the outer edge of a side corresponding to a side of interest of the opening 121 of the mask pattern 120 in orthographic projection with respect to the surface 181. More strictly, "h" can be the distance between the surface 182 and the boundary 140 between the side portion 142 and the bottom portion 143 of the concave portion 122 formed in the first etching step, and "R" can be the length from the boundary 140 to the outer edge of the opening 121 in orthographic projection with respect to the surface 181.

As described above, as shown in FIG. 5A, when the distal end 141 of the concave portion 122 reaches the insulator 119, the first etching step is terminated. Subsequently, it is preferable to form the bottom portion 143 having a curvature near the distal end portion of the concave portion 122 in the opening portion 172 having the taper angle $\theta_2$ in the second etching step. However, this is not exhaustive. At the end of the first etching step, the bottom portion 143 may have a bottom in the substrate 111. If a distance h between the surface 182 and the boundary 140 (the position 118 at which the taper angles switch) between the side portion 142 and the bottom portion 143 of the concave portion 122 at the end of the first etching step satisfies $h \leq R \tan \theta_2$ described above, the formation of the opening portion 144 having a vertical shape is suppressed in the second etching step. Accordingly, the distal end of the concave portion 122 in the first etching step need not have reached the insulator 119.

Figure 3A:
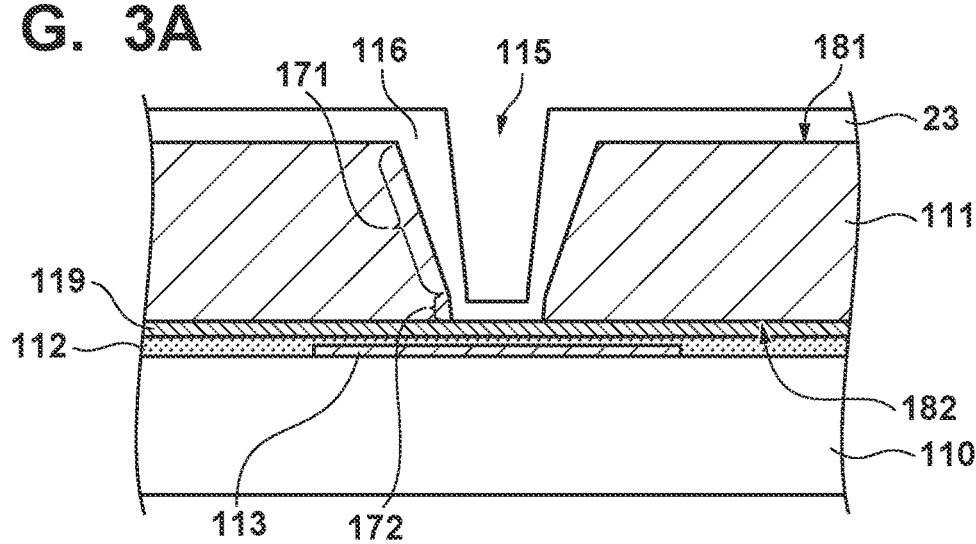
FIGS. 3A to 3C are views showing a method of manufacturing the through electrode in FIG. 1.
Figure 3B:
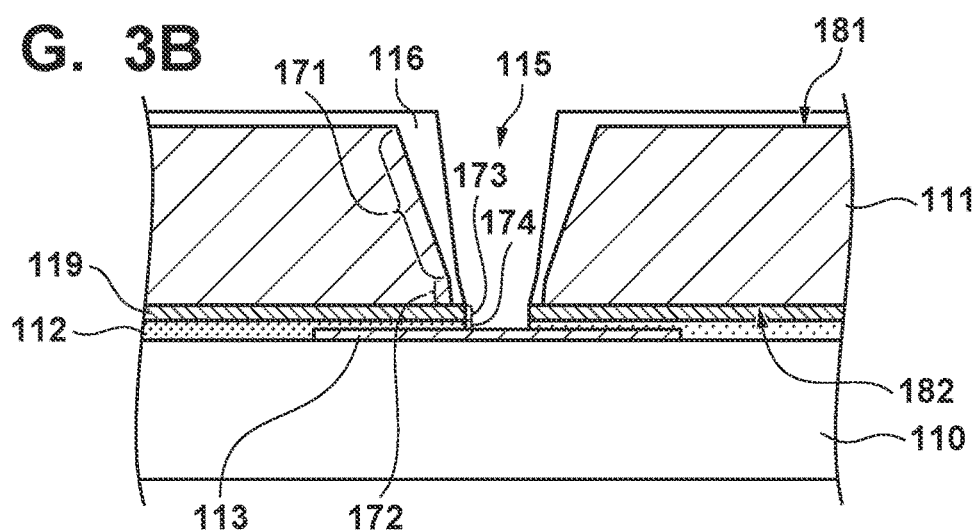

As shown in FIG. 3A, after the formation of the through hole 115, the mask pattern 120 is removed, and the insulating material film 123 for forming the insulating layer 116 is deposited by using, for example, the plasma CVD method. For example, silicon oxide, silicon nitride, or silicon oxynitride may be used for the insulating material film 123. The following description will be made assuming that silicon oxide is used. After the formation of the insulating material film 123, the insulating material film 123, the insulator 119, and the bonding member 112 deposited on the bottom portion of the through hole 115 are removed. In this step, as shown in FIG. 3B, the through hole 115 extends through to the electrode layer 113 on the substrate 110, and the insulating layer 116 is formed on the side surface of the through hole 115. In the state shown in FIG. 3A, performing dry etching of the insulating material film 123 will mainly etch the insulating material film 123 deposited on the surface of the substrate 111 whose etched surface is in a horizontal direction and the bottom portion of the through hole 115. The insulating material film 123 is deposited thicker on the surface 181 of the substrate 111 than on the bottom portion of the through hole 115. For this reason, even if the insulating material film 123 on the bottom portion of the through hole 115 is removed, the elimination of the insulating material film 123 on the surface 181 of the substrate 111 is suppressed. In addition, the insulating material film 123 deposited on the side surface of the through hole 115 becomes thinner toward the bottom portion of the through hole 115, and the thickness of the insulating material film 123 on the side surface of the bottom portion of the through hole 115 is almost equal to that of the insulating material film 123 deposited on the bottom portion. The insulating material film 123 is deposited on the side surface of the through hole 115 having a taper angle, and the etching rate is sufficiently lower than that of the insulating material film 123 on the bottom portion of the through hole 115. Accordingly, even if the insulating material film 123 on the bottom portion of the through hole 115 is removed, the insulating material film 123 on the side surface of the bottom portion is prevented from disappearing (the insulating layer 116 is not formed).

When the through hole 115 has the same shape as that of the bottom portion 143 shown in FIG. 5A, which has a curvature near the distal end portion as described above, the etching rate of the insulating material film 123 deposited on a portion extending from the boundary 140 to near the distal end 141 is not sufficiently low. For this reason, when the insulating material film 123, the insulator 119, and the bonding member 112 on the bottom portion of the through hole 115 are etched, the insulating material film 123 deposited on a portion extending from the boundary 140 to near the distal end 141 can partly disappear. This makes it impossible to keep insulation between the substrate 111 and the conductive member 117 formed afterward, resulting in an insulation failure in the through electrode. This can lead to deterioration in the reliability of the semiconductor apparatus including the through electrode. However, in this embodiment, when the insulating layer 116 is formed on the side surface of the bottom portion of the through hole 115 as described above, the insulating material film 123 can be prevented from completely disappearing. This can keep insulation between the substrate 111 and the conductive member 117. That is, the occurrence of an insulation failure in the through electrode 114 is suppressed, and deterioration in the reliability of the semiconductor apparatus 100 including the through electrode 114 can be suppressed.

After the insulating material film 123 deposited on the bottom portion of the through hole 115 is removed, the insulator 119 and the bonding member 112 are subsequently etched to form the through hole 115. When the insulator 119 and the insulating material film 123 are the same type of insulating films as in this embodiment, the insulator 119 can be removed under the same etching conditions as those for the insulating material film 123. In addition, when benzocyclobutene (BCB) is used for the bonding member 112, it is possible to remove the bonding member 112 by etching using a $CF_4/O_2$ gas mixture. When BCB is used for the bonding member 112, the carbon component contained in BCB serves as a component that makes a protective film adhere to the insulating material film 123 (insulating layer 116) on the side surface of the through hole 115. Accordingly, it is expected to provide an effect of protecting the insulating material film 123 against etching. When the insulator 119 and the insulating material film 123 are made of silicon oxide ($SiO_2$) as described above, it is possible to collectively etch the insulating material film 123, the insulator 119, and the BCB as the bonding member 112 by etching using a $CF_4/O_2$ gas mixture. The above steps form the through hole 115 including the opening portions 171 and 172 formed in the substrate 111, an opening portion 173 communicating from the opening portion 172 provided in the insulator 119, and an opening portion 174 provided in the bonding member 112. In addition, with these steps, in orthographic projection with respect to the surface 181, the outer edges of the opening portions 173 and 174 are arranged inward from the outer edge of the opening portion 172.

Figure 3C:
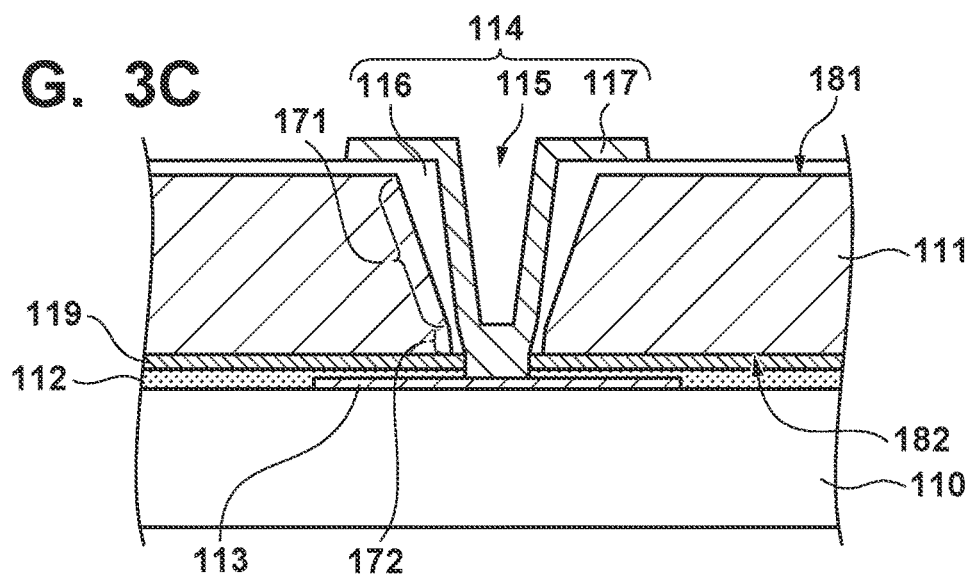

As shown in FIG. 3C, the conductive member 117 made of a conductive material or the like is formed in the through hole 115 to form the through electrode 114 that electrically connects the surface 181 of the substrate 111 to the electrode layer 113 provided on the substrate 110. First of all, the conductive member 117 is formed by, for example, forming a metal serving as a seed layer on the insulating layer 116 on the side surface of the through hole 115 and the surface 181 of the substrate 111 by a sputtering method or the like. The conductive member 117 can be formed by forming a plating layer on the seed layer and then patterning the plating layer together with the seed layer.

As described above, the portion, of the through hole 115 according to this embodiment, which extends through the substrate 111 has a tapered shape whose opening width gradually decreases from the surface 181 of the substrate 111 to the surface 182 without having any vertical portion. This makes the insulating material film 123 and the seed layer have good coverage at the bottom portion of the through hole 115, thereby suppressing the occurrence of insulation failures and plating failures caused by deposition shortage of a seed layer. In addition, this suppresses failure to form the insulating layer 116 on the side surface of the through hole 115 when forming the insulating layer 116 by etching the insulating material film 123, thereby obtaining the highly reliable through electrode 114.

In the step of forming the conductive member 117 in FIG. 3C, the conductive member 117 can also be formed from only a seed layer. More specifically, because the through hole 115 according to this embodiment exhibits good coverage with respect to a seed layer, the conductive member 117 of the through electrode 114 can also be formed from only a seed layer formed by physical vapor deposition such as sputtering without plating. That is, the conductive member 117 need not include a plating layer. In this case, the conductive member 117 may be formed by patterning only a seed layer. This makes it possible to use a thin conductive member and suppress side etching at the time of patterning as compared with the case of patterning a plating layer and a seed layer together. This is advantageous in forming fine wiring patterns. In addition, because no plating step is required, it is possible to simplify the manufacturing process of manufacturing the through electrode 114 and reduce the cost.

As described above, the through hole 115 extending through the substrate 111 includes the opening portion 171 and the opening portion 172 having a larger taper angle than the opening portion 171. First of all, the substrate 111 is etched (first etching step) to form the concave portion 122 forming at least part of the side surface of the opening portion 171. The concave portion 122 is then made to extend through the substrate 111 by using an etching method with higher anisotropy than in the first etching step. At this time, as described above, the first etching step is completed such that the distance h between the surface 182 and the boundary 140 (the position 118 at which the taper angles switch) between the side portion 142 of the concave portion 122, formed in the first etching step, and the bottom portion 143 satisfies $h \leq R \tan \theta_2$. This can improve the reliability of the through electrode 114 formed in the through hole 115. As a result, the reliability of the semiconductor apparatus 100 improves, including an improvement in the manufacturing yield of the semiconductor apparatus 100 including the through electrode 114.

An example of manufacturing a terahertz wave sensor as an embodiment of the semiconductor apparatus including the through electrode 114 having the through hole 115 described above will be described below with reference to FIGS. 6A to 7G. This embodiment exemplifies the manufacture of the through electrode 114 that electrically connects the electrode layer 113 of the substrate 110 to the substrate 111 upon bonding of the substrate 110 to the substrate 111 with the bonding member 112, as shown in FIG. 1.

Figure 6A:
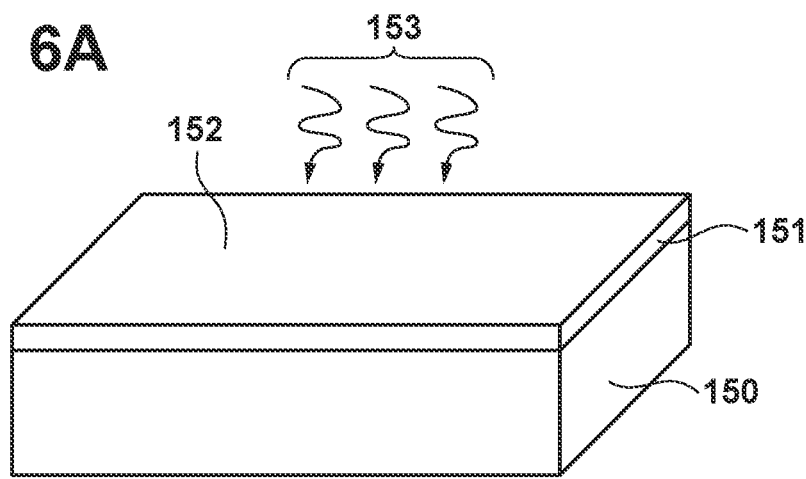
FIGS. 6A to 6C are views showing an embodiment in which the semiconductor apparatus in FIG. 1 is applied to a terahertz wave sensor.

In this embodiment, the substrate 111 in FIG. 1 corresponds to a reception antenna substrate 151 that receives terahertz waves shown in FIG. 6A. The substrate 110 in FIG. 1 corresponds to a readout circuit substrate 150 that processes the signal received by the reception antenna substrate 151. More specifically, the reception antenna substrate 151 having a thickness of 60 µm is bonded to the readout circuit substrate 150 having a thickness of 725 µm. An antenna 154 that detects terahertz waves 153 is provided on an upper surface 152 of the reception antenna substrate 151. The readout circuit substrate 150 also includes a CMOS transistor as a readout circuit. The thickness of the reception antenna substrate 151 was set to 60 µm in consideration of detection efficiency with respect to terahertz waves. However, the design of such a reception antenna substrate can be changed as needed.

Figure 6B:
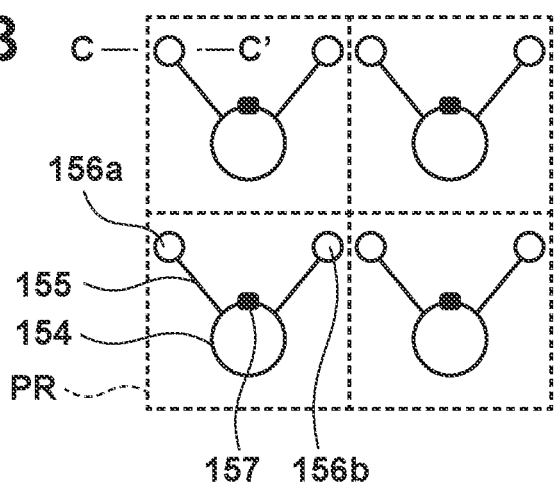
Figure 6C:
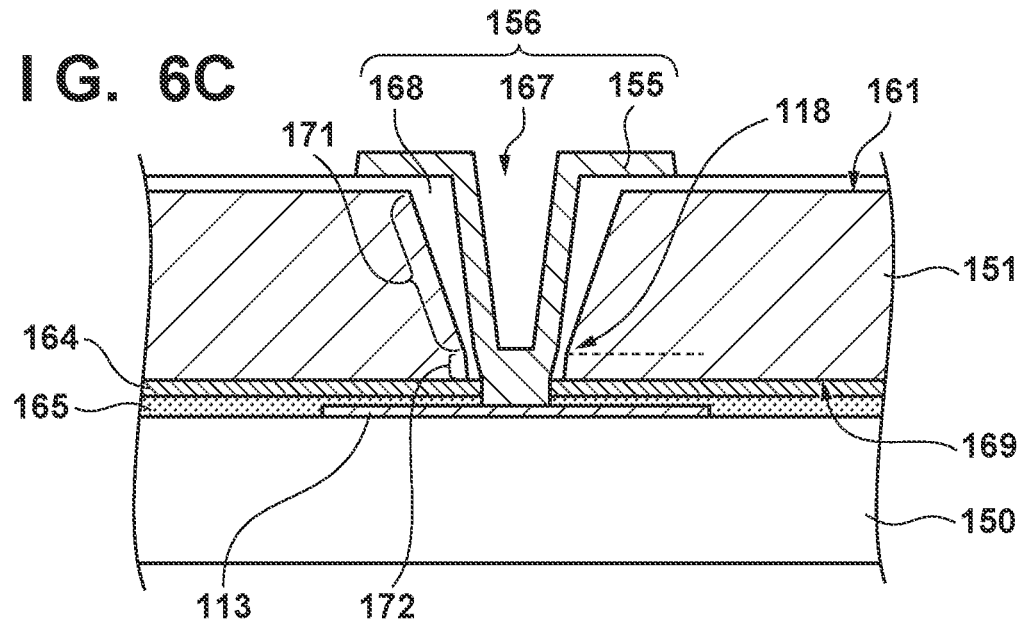

FIG. 6B is an enlarged view of part of the upper surface 152 of the reception antenna substrate 151. FIG. 6C is a sectional view taken along C-C' in FIG. 6B. As shown in FIG. 6B, loop type antennas 154 using Schottky barrier diodes 157 are arranged in a two-dimensional array on the upper surface 152 of the reception antenna substrate 151. One pixel region PR on the reception antenna substrate 151 includes one antenna 154, an anode-side through electrode 156a, and a cathode-side through electrode 156b. This embodiment uses the loop type antenna 154 having a diameter of 140 µm in one 500 µm square pixel region PR. As shown in FIG. 6C, the antenna 154 is electrically connected to the electrode layer 113 of the readout circuit substrate 150 through a through electrode 156 including a conductive member 155.

Figure 7A:
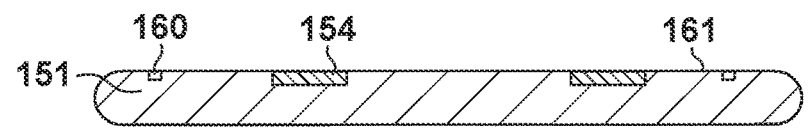
FIGS. 7A to 7G are views showing a method of manufacturing the terahertz wave sensor in FIGS. 6A to 6C.

A method of manufacturing the through electrode 156 according to this embodiment will be described next with reference to FIGS. 7A to 7G. First of all, as shown in FIG. 7A, as the reception antenna substrate 151, a silicon substrate having a diameter of 200 mm and a thickness of 725 µm was used. At least the antennas 154 arranged in a two-dimensional pattern and alignment marks 160 used when patterning or bonding to the readout circuit substrate 150 (to be described later) are arranged on the reception antenna substrate 151. The antennas 154 and the alignment marks 160 are provided on a surface 161 on which the antennas 154 of the reception antenna substrates 151 are provided.

Figure 7B:
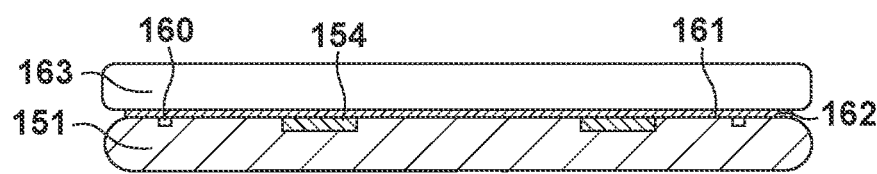

As shown in FIG. 7B, the reception antenna substrate 151 was bonded to a support substrate 163 by using a temporary fixing member 162. As the support substrate 163, a glass substrate having a diameter of 200 mm and a thickness of 500 µm was used. As the temporary fixing member 162, LC-5320 available from 3M was used. First of all, the support substrate 163 was coated with a peeling layer. In this embodiment, as the peeling layer, LTHC (Light-to-Heat Conversion) available from 3M was used. This makes it possible to peel the reception antenna substrate 151 from the support substrate 163 by using laser irradiation in the subsequent step. The support substrate 163 was then coated with the temporary fixing member 162 by spin coating, and the reception antenna substrate 151 was bonded to the support substrate 163.

Figure 7C:
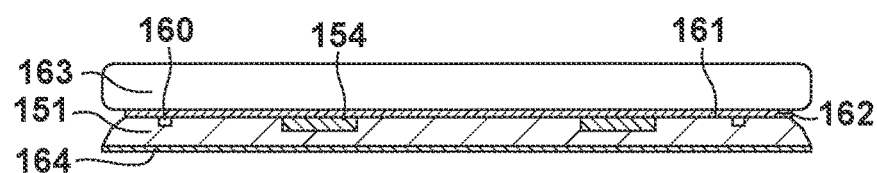

After the reception antenna substrate 151 was bonded to the support substrate 163, the surface of the reception antenna substrate 151 to which the readout circuit substrate 150 was bonded was ground by a backgrind machine to reduce the thickness of the reception antenna substrate 151 to 60 µm, as shown in FIG. 7C. Thereafter, silicon oxide ($SiO_2$) was deposited on the ground surface to a thickness of 100 nm by a plasma CVD method as an insulator 164 functioning as an etching stop layer.

Figure 7D:
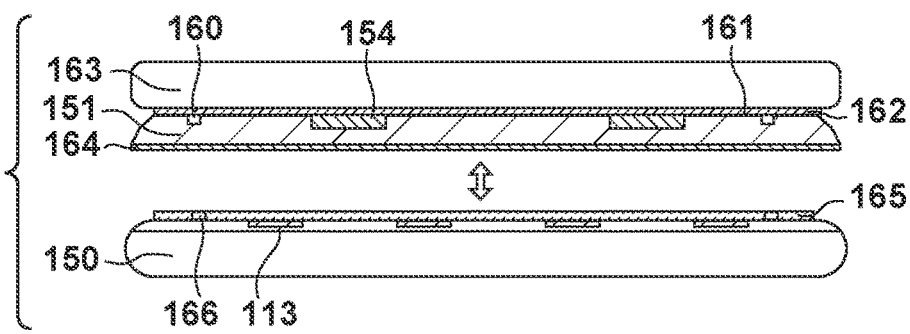

As shown in FIG. 7D, the surface, of the readout circuit substrate 150 having a diameter of 200 mm and a thickness of 725 µm, on which the electrode layer 113 was provided was coated with benzocyclobutene (BCB) as a bonding member 165 to a thickness of 1 µm by a spin coating method. The readout circuit substrate 150 includes a circuit substrate that can read out a signal, for each pixel, from the antenna 154 arranged on the reception antenna substrate 151. Pixel circuits are formed at a period of 500 µm in correspondence with the antennas 154 arranged in a two-dimensional array. The surface, of the readout circuit substrate 150, on which the electrode layer 113 bonded to the reception antenna substrate 151 is provided is provided with an alignment mark 166 used for bonding to the reception antenna substrate 151.

The reception antenna substrate 151 was then bonded to the readout circuit substrate 150 by using a wafer bonder (EVG520IS available from EVG) upon alignment using an alignment mark 160 on the reception antenna substrate 151 and the alignment mark 166 on the readout circuit substrate 150. More specifically, the reception antenna substrate 151 and the readout circuit substrate 150 were held at 200° C. for 2 hr while a load of 3 kN was applied to them. This cured the BCB as the bonding member 165 to bond the reception antenna substrate 151 to the readout circuit substrate 150.

Figure 7E:
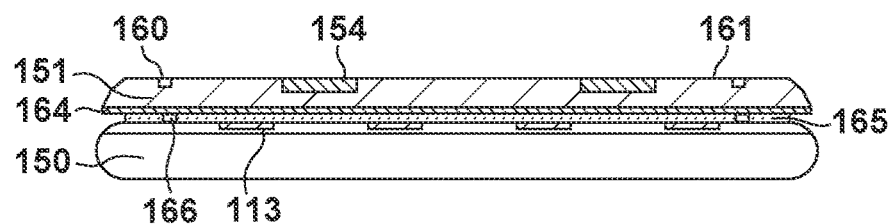

After the reception antenna substrate 151 was bonded to the readout circuit substrate 150, the support substrate 163 was peeled from the reception antenna substrate 151, as shown in FIG. 7E. More specifically, laser light was applied from the surface, of the support substrate 163, which is located on the opposite side to the surface to which the reception antenna substrate 151 is bonded, and the above LTHC was heated to peel the support substrate 163 from the temporary fixing member 162. Thereafter, the temporary fixing member 162 remaining on the reception antenna substrate 151 was removed by using a peel tape or solvent.

Figure 7F:
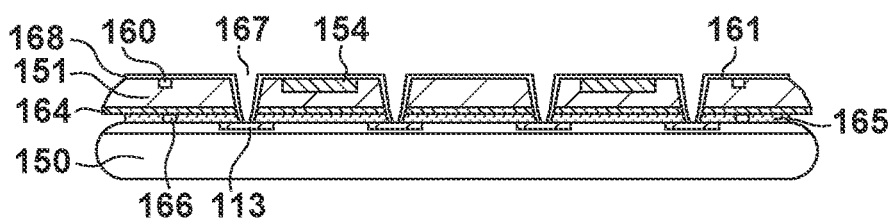

As shown in FIG. 7F, a through hole 167 is formed to expose the electrode layer 113 from the surface 161 of the reception antenna substrate 151. First of all, a mask pattern was formed by using the alignment marks 160. The mask pattern has openings, each having a diameter of 20 µm, formed in the surface 161 of the reception antenna substrate 151 and arranged at positions respectively corresponding to the electrode layers 113 of the readout circuit substrate 150. The first etching step described above was then performed to etch the reception antenna substrate 151 through the openings in the mask pattern. The first etching step used plasma dry etching. The substrate obtained by bonding the readout circuit substrate 150 to the reception antenna substrate 151 was placed at a predetermined position on the stage in the chamber of an etching apparatus. A power of 1.5 kW was supplied to this chamber, and a gas mixture of $SF_6$:$C_4F_8$:$O_2$=2:2:1 was injected into this chamber. In addition, the first etching step was performed by applying a bias of 60 W to the stage on which the substrate obtained by bonding the readout circuit substrate 150 to the reception antenna substrate 151 was placed. The first etching step was performed until the state shown in FIG. 2C described above was reached, in which the distal end of the concave portion 122 reached the insulator 164 functioning as an etching stop layer. The end of the first etching step can be determined by, for example, monitoring plasma light emission during the etching. The opening portion in the surface 161 of the concave portion 122 formed by the first etching step had a diameter of 45 µm and a taper angle of 80°.

Subsequently, in the second etching step, 10 cycles of Bosch processes were performed under the condition that a 0.8-µm hole was formed in 1 cycle. With this step, the position 118 shown in FIG. 6C at which taper angles switch was set at a position 10 µm away from a surface 169 (insulator 164), of the reception antenna substrate 151, which is located beside the readout circuit substrate 150, and the through hole 167 having a diameter of about 25 µm was formed at the position 118 at which the taper angles switch. The taper angle of the opening portion 172 formed in the second etching step was 85°.

In order to ensure insulation between the conductive member 155 formed afterward and the reception antenna substrate 151, a TEOS (Tetraethoxysillane) film was formed as the insulating material film 123 by using a plasma CVD method in the same manner as that shown in FIG. 3A. When the coverage of the insulating material film 123 was checked, the film had a thickness of 1.5 µm on the surface 161 of the reception antenna substrate 151, a thickness of 800 nm on the side surface of the through hole 167, and a thickness of 750 nm on the bottom portion.

As in the same manner as that shown in FIG. 3B, the TEOS film as the insulating material film 123, $SiO_2$ as the insulator 164, and BCB as the bonding member 165, which were deposited on the through hole 167, were dry-etched in a $CF_4/O_2$ gas mixture. With this step, the through hole 167 extended through up to the electrode layer 113 to become the state shown in FIG. 7F. After the through hole 167 was formed, an insulating layer 168 formed from the insulating material film 123 had a thickness of 500 nm on the surface 161 of the reception antenna substrate 151, and a thickness of 400 nm on the side surface of the through hole 167. There was no portion on the side surface of the through hole 167 on which the insulating layer 168 was not formed (disappeared).

Figure 7G:
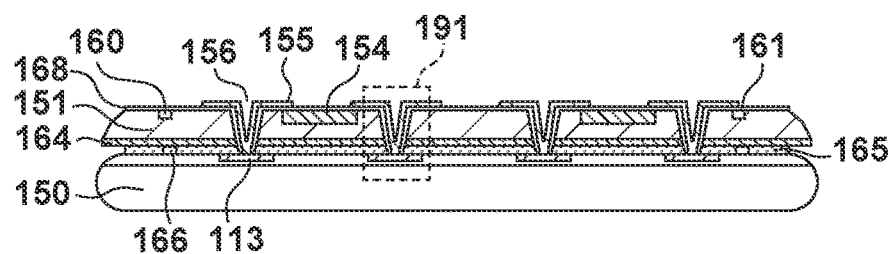

After the through hole 167 was formed, the conductive member 155 was formed. More specifically, a metal film was formed on the inside of the through hole 167 and the surface 161 of the reception antenna substrate 151 by using a sputtering method as a physical vapor deposition method, and Cu plating was performed by using the metal film as a seed layer. In this embodiment, a multilayer film made of Ti and Cu was used as a seed layer. When film formation was performed under the condition that a seed layer was deposited to 1 µm (Cu (600 nm)/Ti (400 nm)) on the surface 161 of the reception antenna substrate 151, the seed layer was deposited to 50 nm on the side surface of the through hole 167 and to 40 nm on the bottom portion. Thereafter, Cu plating was performed to deposit a plating film to 5 µm on the seed layer on the surface 161 of the reception antenna substrate 151. After plating was performed, patterning was performed by wet etching to pattern the seed layer and the Cu plating layer formed on the surface 161 of the reception antenna substrate 151, thereby forming the conductive member 155 connected to the antenna 154. FIG. 7G shows this state. FIG. 6C described above corresponds to an enlarged view of a portion 191 in FIG. 7G.

The above steps obtained a terahertz wave sensor having the antenna 154 formed on the surface 161 of the reception antenna substrate 151 electrically connected to the electrode layer 113 of the readout circuit substrate 150 by using the through electrode 156 having the conductive member 155 provided in the through hole 167. No connection failure such as disconnection was found in the connection between the antenna 154 and the electrode layer 113 in the obtained terahertz wave sensor. In addition, no insulation failures were found between the conductive member 155, the reception antenna substrate 151, and the readout circuit substrate 150. That is, this embodiment was able to implement the highly reliable through electrode 156.

As has been described above, this embodiment has exemplified the terahertz wave sensor. However, the present invention is not limited to this and can be applied to sensors for electromagnetic waves other than terahertz waves, for example, an infrared sensor. In addition, as described above, this embodiment provides a highly reliable through electrode using a through hole exhibiting good coverage with respect to an insulating layer and a conductive member up to the bottom portion of the through hole, and a method of manufacturing the through electrode. Accordingly, the above through electrode can be applied to various types of semiconductor apparatuses including semiconductor devices as well as electromagnetic wave sensors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-110519, filed Jun. 13, 2019 which is hereby incorporated by reference herein in its entirety.

What is claimed is:

1. A semiconductor apparatus comprising a first substrate that has a first surface and a second surface on an opposite side to the first surface and is provided with a through hole extending through from the first surface to the second surface and an insulating layer and a conductive member that are provided in the through hole,
    wherein the through hole includes a first opening portion formed in the first substrate and a second opening portion provided between the first opening portion and the second surface,
    wherein the first opening portion and the second opening portion each have a tapered shape whose opening width decreases from the first surface to the second surface,
    wherein a first taper angle formed by a side surface of the first opening portion and a plane parallel to the second surface is smaller than a second taper angle formed by a side surface of the second opening portion and a plane parallel to the second surface,
    wherein a second substrate is bonded to the second surface of the first substrate via a bonding member, and
    wherein the bonding member is provided with a third opening portion, which communicates from the second opening portion and is provided with the conductive member.

2. The apparatus according to claim 1, wherein the first taper angle is 75° to 85°.

3. The apparatus according to claim 1, wherein the conductive member electrically connects an element provided on the first surface to an electrode layer provided on a side of the second substrate, which is located beside the first substrate.

4. The apparatus according to claim 1, wherein in an orthographic projection with respect to the first surface, an outer edge of the third opening portion is provided inward from an outer edge of the second opening portion.

5. The apparatus according to claim 1, wherein an insulator is provided between the bonding member and the second surface.

6. The apparatus according to claim 5, wherein the insulator is provided with a fourth opening portion, which communicates from the second opening portion and is provided with the conductive member, and wherein in an orthographic projection with respect to the first surface, an outer edge of the fourth opening portion is provided inward from an outer edge of the second opening portion.

7. The apparatus according to claim 5, wherein the bonding member comprises benzocyclobutene, and the insulator comprises silicon oxide.

8. The apparatus according to claim 1, further comprising an electromagnetic wave sensor.

9. The apparatus according to claim 8, wherein the electromagnetic wave sensor comprises a terahertz wave sensor.

10. A method of manufacturing a semiconductor apparatus comprising a first substrate that has a first surface and a second surface on an opposite side to the first surface and is provided with a through hole extending through from the first surface to the second surface and an insulating layer and a conductive member that are provided in the through hole, wherein the through hole includes a first opening portion formed in the first substrate and a second opening portion provided between the first opening portion and the second surface, wherein the first opening portion and the second opening portion each have a tapered shape whose opening width decreases from the first surface to the second surface, wherein a first taper angle formed by a side surface of the first opening portion and a plane parallel to the second surface is smaller than a second taper angle formed by a side surface of the second opening portion and a plane parallel to the second surface, wherein a second substrate is bonded to the second surface of the first substrate via a bonding member, and wherein the bonding member is provided with a third opening portion which communicates from the second opening portion and is provided with the conductive member, the method comprising forming the through hole comprising:

forming a mask pattern on the first surface;

forming a concave portion forming a side surface of the first opening portion in the first substrate by etching the first substrate through an opening of the mask pattern; and forming the second opening portion by performing etching with higher anisotropy than in the forming the concave portion through the opening after the forming the concave portion, wherein the forming the concave portion is performed such that a height h from the second surface to a position at which taper angles switch between the first opening portion and the second opening portion satisfies:

$h \leq R \tan \theta_2$, where R is a length from an outer edge at the position at which the taper angles switch to an outer edge of the opening of the mask pattern in an orthographic projection with respect to the first surface, and $\theta_2$ is the second taper angle.

11. The method according to claim 10, wherein the concave portion has a bottom in the first substrate.

12. The method according to claim 10, further comprising forming an insulator on the second surface before the forming the concave portion.

13. The method according to claim 12, further comprising:

bonding the second substrate to the second surface of the first substrate via the bonding member after the forming the insulator and before the forming the concave portion;

exposing the second substrate by etching the insulator and the bonding member after the forming the second opening portion; and forming a conductive member provided in the through hole to electrically connect the first substrate to the second substrate.

14. The method according to claim 13, wherein the conductive member is formed by physical vapor deposition.

15. The method according to claim 13, wherein the conductive member includes no plating layer.

16. The method according to claim 10, further comprising forming an insulator on the second surface before the forming the concave portion, wherein the forming the concave portion is completed in accordance with arrival of a distal end of the concave portion at the insulator in the forming the concave portion.

17. A semiconductor apparatus comprising a first substrate that has a first surface and a second surface on an opposite side to the first surface and is provided with a through hole extending through from the first surface to the second surface and an insulating layer and a conductive member that are provided in the through hole, wherein the through hole includes a first opening portion formed in the first substrate and a second opening portion provided between the first opening portion and the second surface, wherein the first opening portion and the second opening portion each have a tapered shape whose opening width decreases from the first surface to the second surface, wherein a first taper angle formed by a side surface of the first opening portion and a plane parallel to the second surface is smaller than a second taper angle formed by a side surface of the second opening portion and a plane parallel to the second surface, wherein a second substrate is bonded to the second surface of the first substrate via a bonding member, and wherein an insulator is provided between the bonding member and the second surface.

18. The apparatus according to claim 17, wherein the first taper angle is 75° to 85°.

19. The apparatus according to claim 17, wherein the conductive member electrically connects an element provided on the first surface to an electrode layer provided on a side of the second substrate, which is located beside the first substrate.

20. The apparatus according to claim 17, wherein the bonding member is provided with a third opening portion, which communicates from the second opening portion and is provided with the conductive member, and wherein in an orthographic projection with respect to the first surface, an outer edge of the third opening portion is provided inward from an outer edge of the second opening portion.

21. The apparatus according to claim 17, wherein the insulator is provided with a fourth opening portion which communicates from the second opening portion and is provided with the conductive member, and wherein in orthographic projection with respect to the first surface, an outer edge of the fourth opening portion is provided inward from an outer edge of the second opening portion.

22. The apparatus according to claim 17, wherein the bonding member comprises benzocyclobutene, and the insulator comprises silicon oxide.

23. The apparatus according to claim 17, further comprising an electromagnetic wave sensor.

24. The apparatus according to claim 23, wherein the electromagnetic wave sensor comprises a terahertz wave sensor.

25. A method of manufacturing a semiconductor apparatus comprising a first substrate that has a first surface and a second surface on an opposite side to the first surface and is provided with a through hole extending through from the first surface to the second surface and an insulating layer and a conductive member that are provided in the through hole,
wherein the through hole includes a first opening portion formed in the first substrate and a second opening portion provided between the first opening portion and the second surface,
wherein the first opening portion and the second opening portion each have a tapered shape whose opening width decreases from the first surface to the second surface,
wherein a first taper angle formed by a side surface of the first opening portion and a plane parallel to the second surface is smaller than a second taper angle formed by a side surface of the second opening portion and a plane parallel to the second surface,
wherein a second substrate is bonded to the second surface of the first substrate via a bonding member, and
wherein an insulator is provided between the bonding member and the second surface,
the method comprising forming the through hole comprising:
forming a mask pattern on the first surface;
forming a concave portion forming a side surface of the first opening portion in the first substrate by etching the first substrate through an opening of the mask pattern; and
forming the second opening portion by performing etching with higher anisotropy than in the forming the concave portion through the opening after the forming the concave portion,
wherein the forming the concave portion is performed such that a height h from the second surface to a position at which taper angles switch between the first opening portion and the second opening portion satisfies:

$$h \leq R \tan \theta_2,$$

where R is a length from an outer edge at the position at which the taper angles switch to an outer edge of the opening of the mask pattern in an orthographic projection with respect to the first surface, and $\theta_2$ is the second taper angle.

* * * * *